US008356689B2

(12) United States Patent
Huang

(10) Patent No.: US 8,356,689 B2
(45) Date of Patent: Jan. 22, 2013

(54) STRUCTURE FOR THE COMPOSITELY FORMED SOUND BOX

(75) Inventor: Chen-Hui Huang, Taoyuan (TW)

(73) Assignee: Harman International Industries, Inc., Northridge, CA (US)

( * ) Notice: Subject to any disclaimer, the term of this patent is extended or adjusted under 35 U.S.C. 154(b) by 2800 days.

(21) Appl. No.: 09/921,563

(22) Filed: Aug. 6, 2001

(65) Prior Publication Data

US 2011/0088965 A1 Apr. 21, 2011

(51) Int. Cl.

*A47B 81/06* (2006.01)
*H05K 5/02* (2006.01)
*A47B 81/00* (2006.01)
*H05K 5/00* (2006.01)
*H04R 1/20* (2006.01)

(52) U.S. Cl. ......... 181/199; 181/151; 381/353; 381/354

(58) Field of Classification Search .................. 181/199, 181/198, 151, 148, 146; 381/345, 346, 353, 381/354; D14/204, 214

See application file for complete search history.

(56) References Cited

U.S. PATENT DOCUMENTS

| | | | | | |
|---|---|---|---|---|---|
| 3,247,926 | A | * | 4/1966 | Metros | 181/151 |
| 3,275,100 | A | * | 9/1966 | Dunning | 381/348 |
| 3,430,728 | A | * | 3/1969 | Dunning | 381/348 |
| 3,652,360 | A | * | 3/1972 | Hartman et al. | 156/244.11 |
| 3,757,890 | A | * | 9/1973 | Dunning | 381/351 |
| 3,802,950 | A | * | 4/1974 | Stevens | 428/215 |
| 4,044,855 | A | * | 8/1977 | Kobayashi | 181/151 |
| 4,109,983 | A | * | 8/1978 | Kinoshita | 312/7.1 |
| 4,168,762 | A | * | 9/1979 | Griffin, Jr. | 181/199 |
| 4,230,905 | A | * | 10/1980 | Crum et al. | 381/300 |
| 4,592,444 | A | * | 6/1986 | Perrigo | 181/151 |
| 4,596,305 | A | * | 6/1986 | Jagborn | 181/151 |
| 4,640,381 | A | * | 2/1987 | Tsuchiya et al. | 181/144 |
| 4,690,244 | A | * | 9/1987 | Dickie | 181/146 |
| 4,869,340 | A | * | 9/1989 | Coudoux | 181/146 |
| 4,924,964 | A | * | 5/1990 | Olsen | 181/151 |
| 4,964,482 | A | * | 10/1990 | Meyer | 181/146 |
| 5,046,104 | A | * | 9/1991 | Kloss | 381/335 |
| 5,194,701 | A | * | 3/1993 | Yamada-Scriba | 181/151 |
| 5,218,176 | A | * | 6/1993 | Meyer, Jr. | 181/199 |
| 5,807,618 | A | * | 9/1998 | Shiota et al. | 428/35.7 |
| 6,675,932 | B2 | * | 1/2004 | Manrique et al. | 181/199 |
| 6,719,092 | B1 | * | 4/2004 | Barbetta | 181/199 |
| 6,808,044 | B1 | * | 10/2004 | Barbetta | 181/199 |
| 7,096,995 | B2 | * | 8/2006 | Cox et al. | 181/199 |
| 2004/0251079 | A1 | * | 12/2004 | Plummer | 181/199 |
| 2008/0006477 | A1 | * | 1/2008 | Huang | 181/199 |

* cited by examiner

*Primary Examiner* — Edgardo San Martin
(74) *Attorney, Agent, or Firm* — Brooks Kushman P.C.

(57) ABSTRACT

An improved structure for the compositely formed sound box consists of a plastic-made box with one-way opening and intensified rib and inlet components provided inside the box. The main feature is the bubbled one-piece soundproof layer inside the sound box to expand the overall structure of the sound box, reduce the thickness of the sound box, minimize the thickness of the shell, and upgrade the soundproof performance at the same time.

7 Claims, 5 Drawing Sheets

STRUCTURE FOR THE COMPOSITELY FORMED SOUND BOX

BACKGROUND OF THE INVENTION

1. Field of the Invention

The present invention relates to an improved structure for the compositely formed sound box and is designed to reduce the thickness of sound box's shell, intensify the hardness of shell, and upgrade the soundproof performance of the sound box at the same time.

2. Description of the Prior Art

Conventionally, the sound boxes were made of woods. The plastic-made sound boxes became popular only in recent years. FIG. 1 shows the one-pieced sound box, which is stuffed with plastic material and is manufactured by the revolving-formed method and, consequently, the sound box is nothing but a box without any holes to accommodate any components. The intensified ribs and the inlet component's opening cannot be manufactured when the sound box is formed. Therefore, the sound box needs to be processed again after it is manufactured and requires additional costs. Another disadvantage originates from the manufacturing process. The plastic material is poured into the boiling molds first. As soon as the plastic material cools down, the same grade of bubbled plastic material is poured into the mold and is revolved in order to create a bubbled soundproof layer. The process takes 40 minutes, which is excessively time-consuming. Therefore, the production is limited to a certain level.

FIG. 2 shows the new sound box, which is made by the injection method. This method allows higher production speed and requires fewer costs. The box accommodates the intensified ribs and inlet components, but the soundproof performance is inferior. Additionally, the box has to be thicker than 5 mm so as to eliminate the noise generated by the shell when the voice comes through the sound box.

In an effort to solve these problems, the inventor has studied the aforementioned problems thoroughly and conducted several experiments before he invented the present invention.

SUMMARY OF THE INVENTION

The main purpose of present invention is to improve the structure of the compositely formed sound box in order to reduce the thickness of materials of the shell, intensify the hardness of the shell, and upgrade the soundproof performance at the same time.

To serve the foregoing purposes, the improved structure for the compositely formed sound box consists of a box with one-way opening and is formed by the plastic materials with parallel intensified ribs installed inside the box. The main feature of present invention is the bubbled one-piece intensified soundproof layer installed inside the box to upgrade the hardness of the structure, reduce the thickness of the shell, and improve the soundproof performance at the same time.

The value of present invention will be justified in regard to its technical content after reading the detailed description of the preferred embodiments of the present invention in reference to the accompanying drawings, wherein:

DETAILED DESCRIPTION OF THE PREFERRED EMBODIMENT

Figure 3:
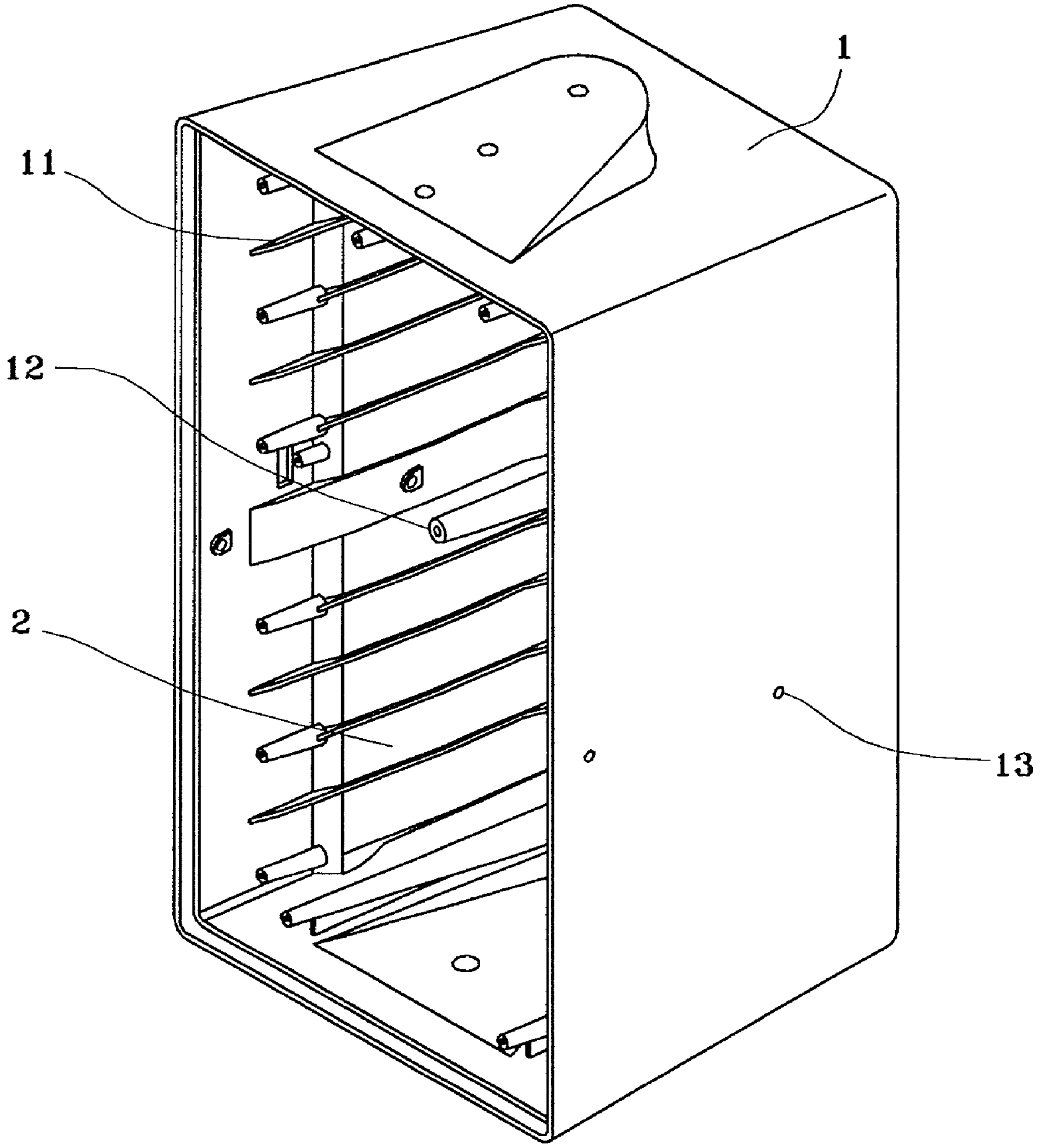
FIG. 3 is a stereoscopic view of present invention.
Figure 4:
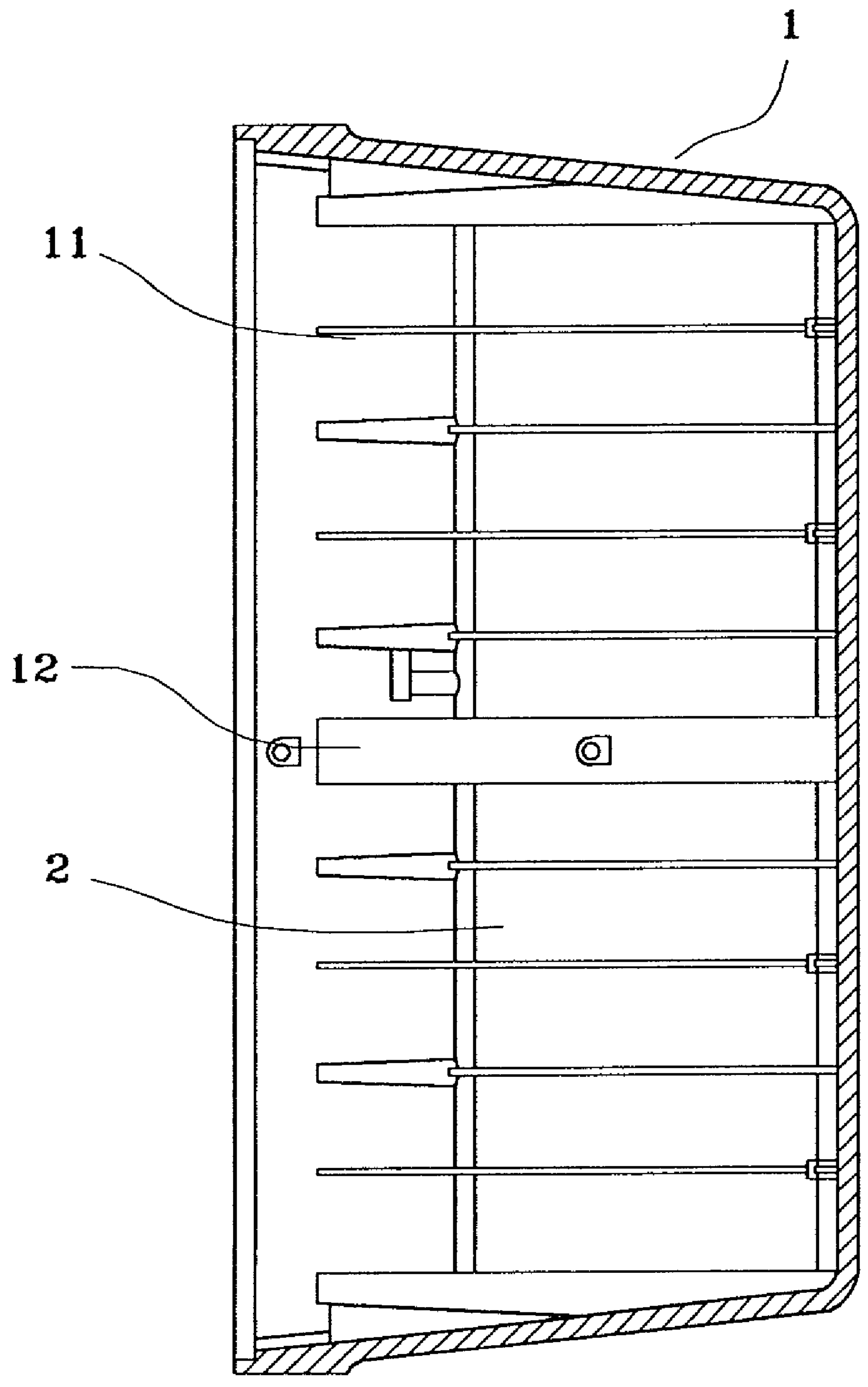
FIG. 4 is a schematic view showing the process of the bubbled layer's formation of present invention.
Figure 5:
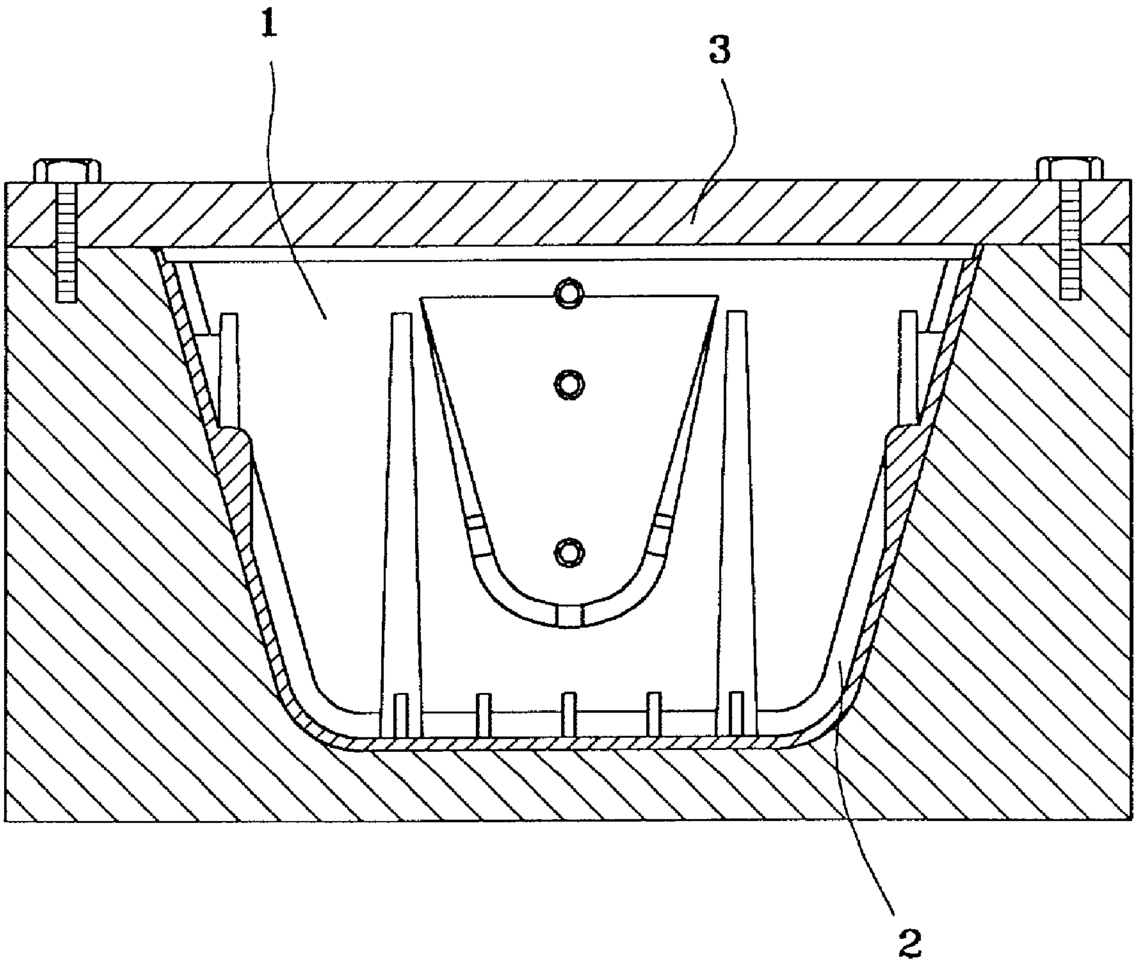
FIG. 5 is the sectional view of present invention.

As shown by FIG. 3 through FIG. 5 regarding the improved structure for the compositely formed sound box, the sound box 1 consists of a one-way box formed by plastic material with the intensified ribs 11 and the opening 13 inside the box. The main feature is the bubbled one-piece intensified soundproof layer 2 installed inside the box.

The sound box 1 can be made in trapezoid shape. The intensified soundproof layer 2 is made of PU and is of same height as the intensified rib 11 installed inside the box. Its thickness varies as the locations of the intensified rib changes. The ideal location for the intensified soundproof layer 2 is between the bottom of the sound box 1 and two third of the shell.

Figure 1:
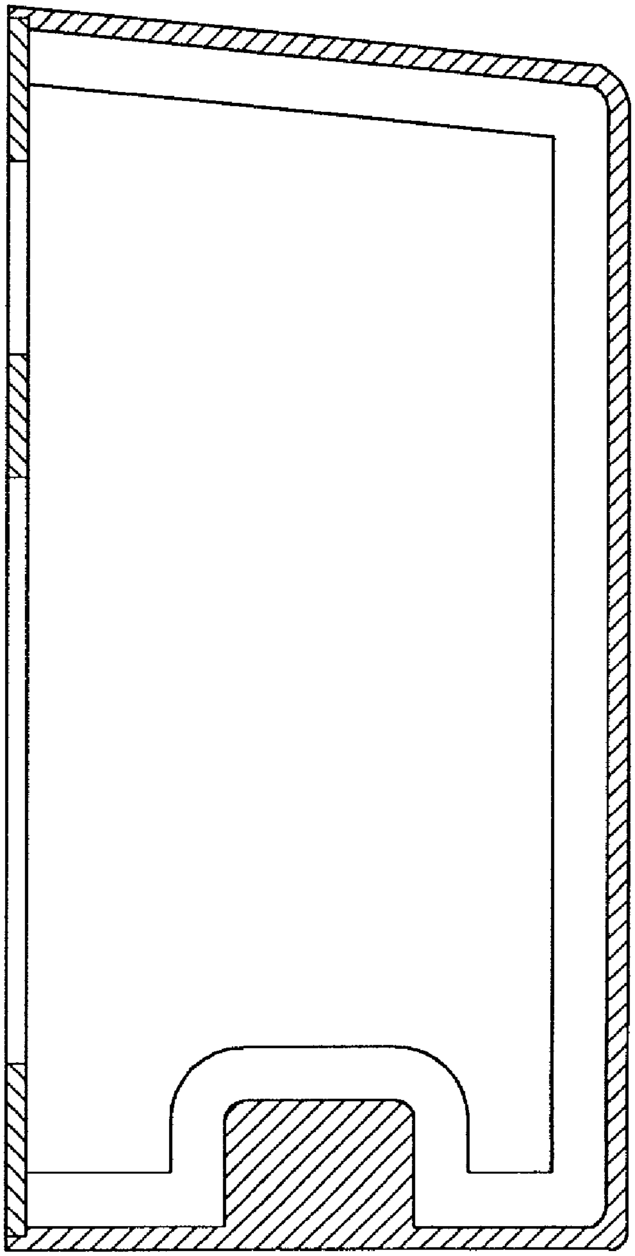
Fig.1 Prior Art
FIG. 1 is an external view of the conventional one-pieced sound box.
Figure 2:
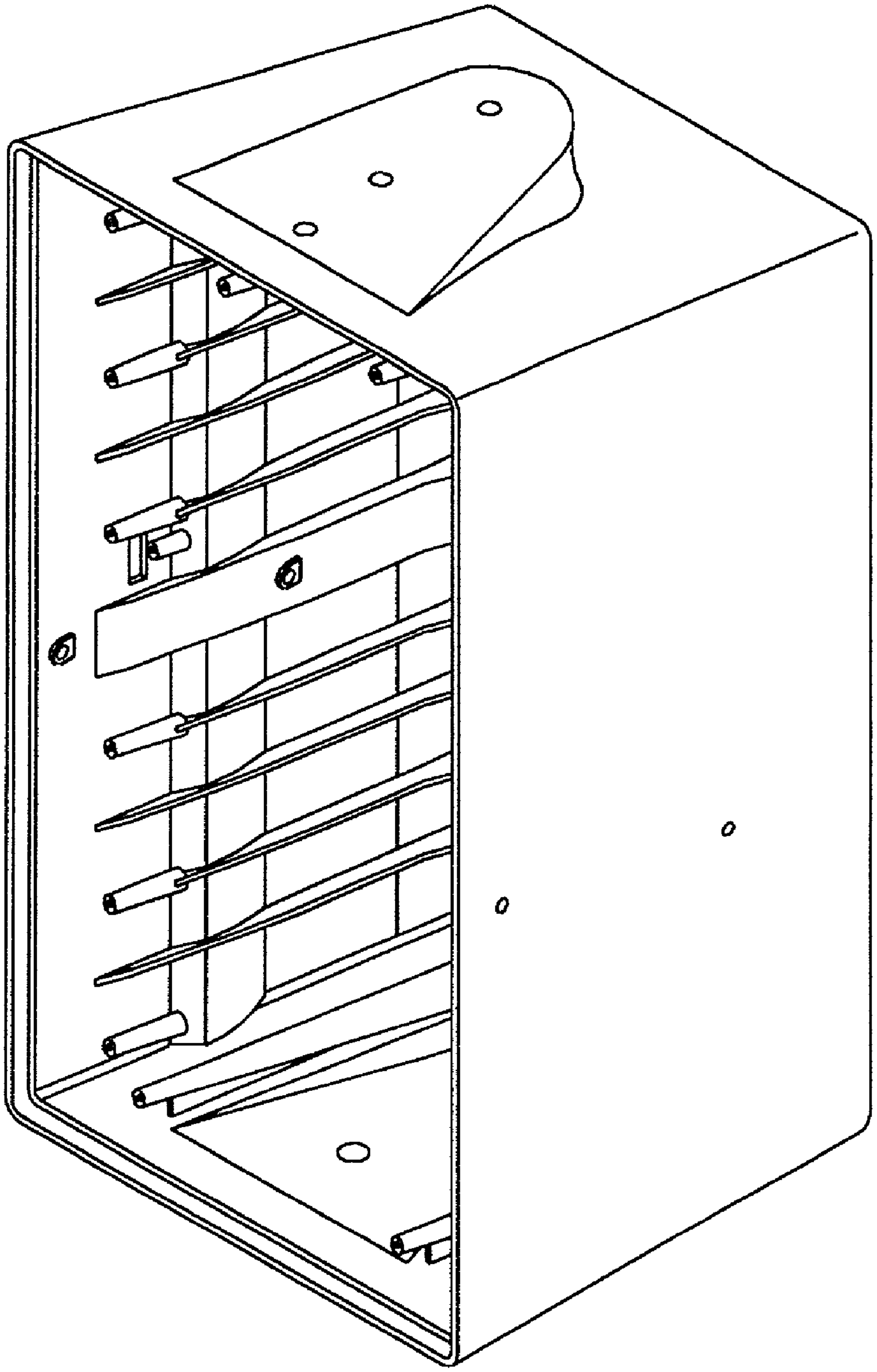
Fig. 2 Prior Art
FIG. 2 is another external view of the conventional one-pieced sound box.

Two sets of molds are required in the manufacturing process. The first mold forms the main unit of sound box 1 first; then the sound box 1 is placed inside the second mold 3 as shown by FIG. 4. The second mold 3 contains sufficient space for bubbling. The bubbling material is then injected into the second mold 3. When the bubbling material cools down, the intensified layer 2 inside the sound box 1 becomes a whole piece. The structure produced by this method is similar to that shown in FIG. 1, but the costs are lower and the production speed is faster. Furthermore, the intensified layer 2 inside the sound box 1 significantly improves the hardness of the structure and, consequently, only 3~5 mm thickness is sufficient for the shell. The higher soundproof performance eliminates the noise outputted by the sound box, which means that the quality of sound is dramatically better than that generated by the conventional sound box.

As indicated by the foregoing statement, the present invention enhances the strength of the structure of the plastic-made sound box and upgrades the soundproof performance significantly. Apparently, the present invention meets the requirements of progressiveness and is of valuable industrially. The inventor hereby presents his invention to the US Patents & Trademarks Office and file for patent.

The aforementioned example is used to describe the purposes, features, and functions of the present invention. To those skilled in the art, modification may be made in the invention without departing from the spirit and scope of the subject invention as set forth in the claims below.

Having thus described my invention, what the inventor claims as new and desire to be secured by US Patents & Trademarks Office include:

1. A sound box structure, comprising:

a box formed from plastic having a plurality of intensified ribs and a one-way opening; and a soundproof layer installed inside the box between the plurality of intensified ribs that structurally increase the strength of the box.

2. The sound box structure of claim 1, where the soundproof layer is a polyurethane foam.

3. The sound box structure of claim 1, where the box formed from plastic is 3-5 mm thick.

4. The sound box structure of claim 1, where the box is a one-way box.

5. The sound box structure of claim 1, where the soundproof layer is a bubbled one-piece intensified soundproof layer.

6. The sound box structure of claim 1, where the box has a trapezoid shape.

7. The sound box structure of claim 2, where the polyurethane foam is of the same height as the intensified ribs.

* * * * *